United States Patent [19]
Michii

[11] Patent Number: 5,105,257
[45] Date of Patent: Apr. 14, 1992

[54] PACKAGED SEMICONDUCTOR DEVICE AND SEMICONDUCTOR DEVICE PACKAGING ELEMENT

[75] Inventor: Kazunari Michii, Itami, Japan

[73] Assignee: Mitsubishi Denki Kabushiki Kaisha, Japan

[21] Appl. No.: 649,977

[22] Filed: Feb. 4, 1991

[30] Foreign Application Priority Data

Aug. 8, 1990 [JP] Japan .................. 2-208213

[51] Int. Cl.⁵ .................. H01L 23/48; H05K 5/02
[52] U.S. Cl. .................. 357/70; 357/68; 357/71; 357/72; 361/421
[58] Field of Search .................. 357/68, 70, 71, 72; 361/421

[56] References Cited

U.S. PATENT DOCUMENTS 4,972,253 11/1990 Palino et al. .................. 357/70

FOREIGN PATENT DOCUMENTS 63-246851 10/1988 Japan .

Primary Examiner—Edward J. Wojciechowicz
Attorney, Agent, or Firm—Leydig, Voit & Mayer

[57] ABSTRACT

A packaged semiconductor device includes trapezoidal power leads and an earth lead in a resin package. The power and earth leads have a large area, radiate heat, and reduce inductance, improving the electrical characteristics of the packaged semiconductor device.

6 Claims, 3 Drawing Sheets

PACKAGED SEMICONDUCTOR DEVICE AND SEMICONDUCTOR DEVICE PACKAGING ELEMENT

BACKGROUND OF THE INVENTION

The present invention relates to a semiconductor device, and particularly to a resin molded semiconductor device packaging element which is formed by sealing a semiconductor element within a resin.

FIG. 1 is a plan view of a conventional semiconductor device. In the drawing, a semiconductor element 1 has many electrodes 2 at the periphery thereof and is placed on a die pad 3. Leads 4 are provided around the semiconductor element 1 and are respectively connected to the electrodes 2 of the semiconductor element 1 by metal wires such as Au wires 5. The members such as the semiconductor element 1, the leads 4 and the like are sealed within a sealing resin with the outer ends of the leads exposed to form a package body 6. In FIG. 1, the sealing resin is not shown.

In the conventional packaged semiconductor device configured as described above, during the operation, heat is generated from the semiconductor element 1 and is transferred to the outside of the semiconductor device 1 through the leads 4 and the package body 6.

In such a packaged semiconductor device, since the size of the package body 6 increases as the number of the leads 4 increases, the leads 4 in the package body 6 become long and thin. This causes increases in the inductance of earth leads and power leads and creates a problem in that switching noise is generated during operation at a high speed, and malfunctions occur.

In addition, if the number of pins is increased, the heating value of the packaged semiconductor device 1 is increased owing to an increase in the degree of integration. However, since the epoxy resin or the like, which forms the package body 6, has low thermal conductivity, the heat generated from the semiconductor element 1 is insufficiently released from the packaged semiconductor device 1 and thus remains therein. There is thus a problem in that the use of a semiconductor element having a high heating value causes the occurrence of malfunctions by the an increase in the temperature of the semiconductor element 1, and thus a deterioration in reliability of the packaged semiconductor device occurs.

Further, when the package body having a multilayer structure is made of a ceramic material having a thermal conductivity which is higher than that of resins, the heat release properties and the electrical characteristics of the packaged semiconductor device formed can be improved. However, there is a problem in that the production cost of the packaged semiconductor device is increased owing to the high price of the ceramic material.

SUMMARY OF THE INVENTION

The present invention has been achieved with a view to solving the above-described problems, and it is an object of the present invention to obtain a packaged semiconductor device at a low price which has excellent electrical characteristics and heat release properties.

To this end, the present invention provides a packaged semiconductor device comprising generally trapezoidal power leads and an earth lead including trapezoidal portions disposed adjacent to the power leads in a first layer of leads; a semiconductor element disposed on the earth lead and having a plurality of electrodes; an insulating substrate disposed surrounding the semiconductor element and on the earth and power leads; a plurality of inner leads in a second layer of leads disposed; on the insulating substrate; metal wires connecting inner ends of the inner leads to respective electrodes signal leads connected to respective outer ends of the inner leads; and a sealing resin encapsulating the semiconductor element, wires, inner leads, power and earth leads, and part of the signal leads forming a package body with part of the signal, power, and earth leads exposed.

DESCRIPTION OF THE PREFERRED EMBODIMENT

Figure 1:
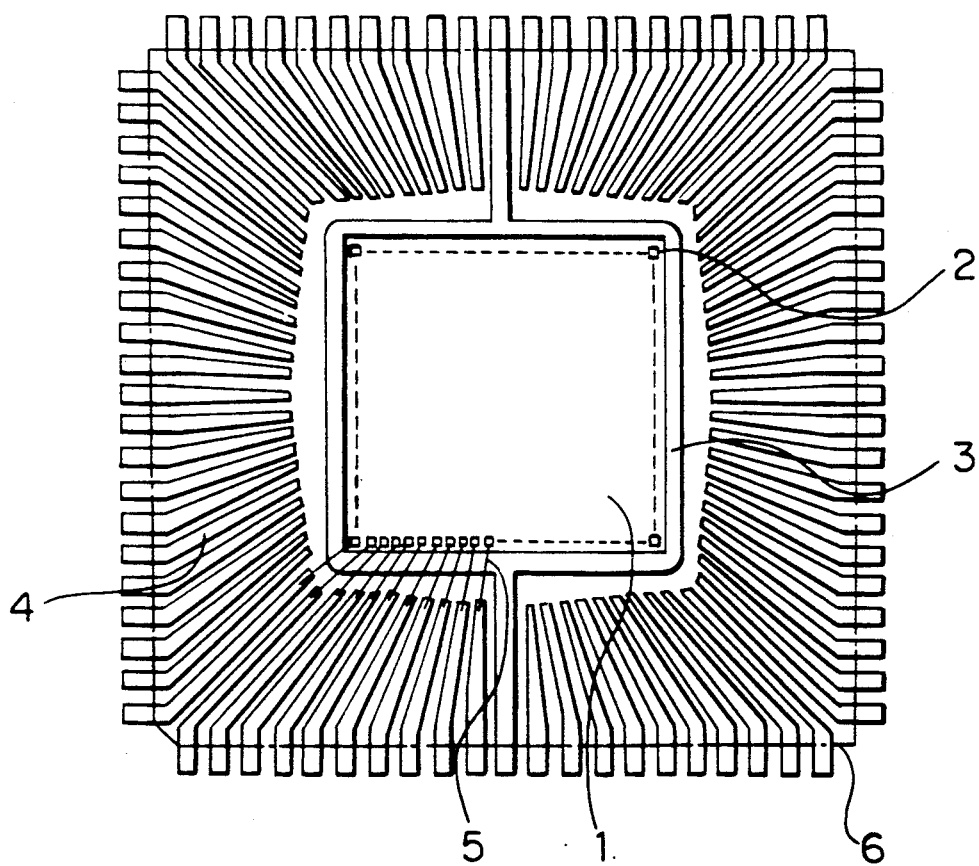
FIG. 1 is a plan view of a conventional semiconductor device.
Figure 2:
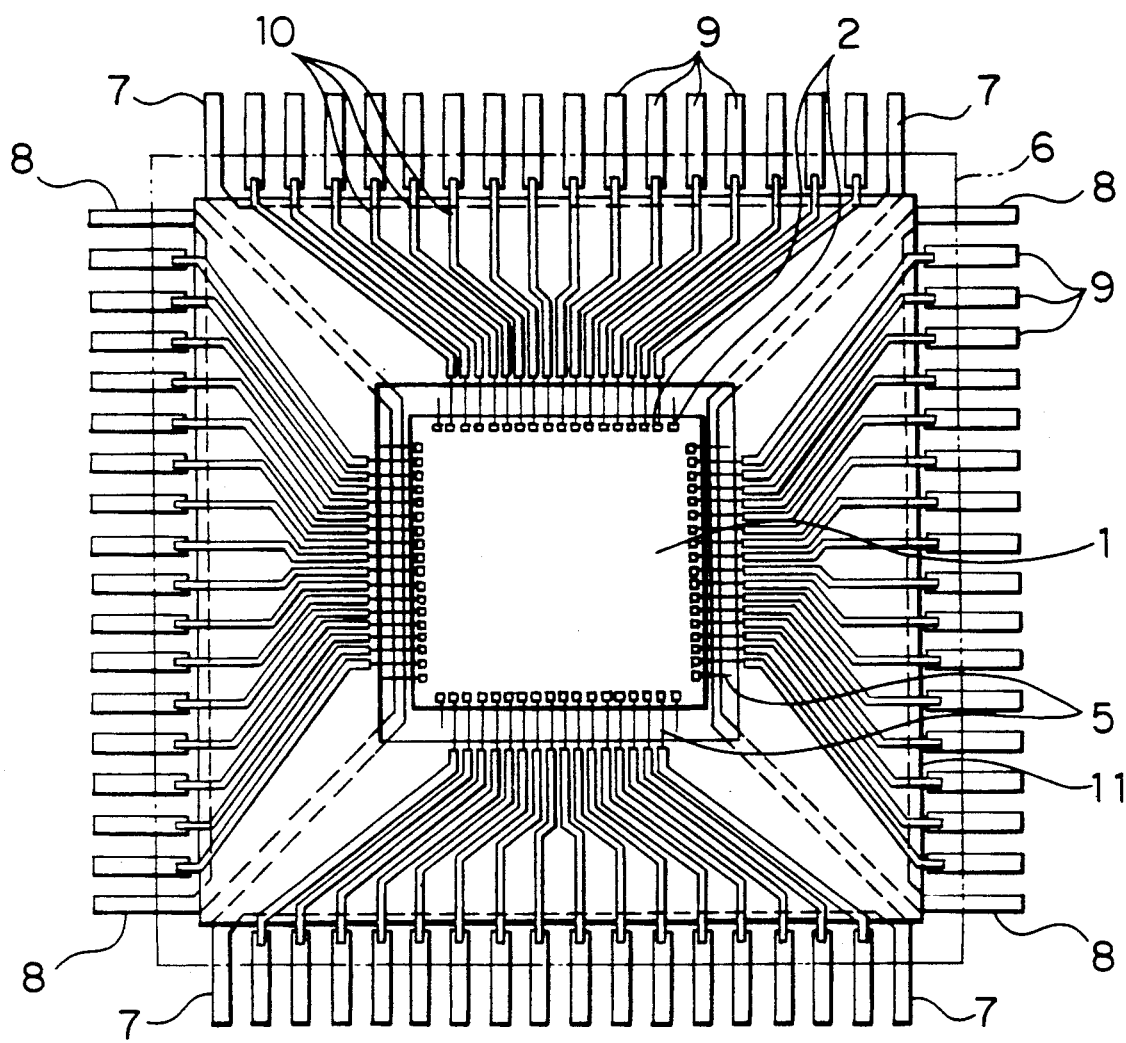
FIG. 2 is a plan view of a semiconductor device in accordance with an embodiment of the present invention.

FIG. 2 is a plan view of a semiconductor device in accordance with an embodiment of the present invention. In the drawing, reference numerals 1, 2, 5 and 6 denote the same elements as those of the conventional semiconductor device. For example, a lead frame made of a Cu material comprises an earth lead 7, power leads 8, cutter signal leads 9 and inner leads 10. The lead frame comprises two-layers of leads. The first layer of leads includes the earth lead 7 and the power leads 8, which have a generally trapezoidal shape so that they are relatively wide as they extend in the package body 6, to the semiconductor element 1. As more clearly shown in FIG. 5, the earth lead 7 includes two substantially trapezoidal portions joined by a generally rectangular portion that serves as a die pad for mounting the semiconductor element 1. The outer signal leads a also lie in substantially the same plane as the earth lead 7 and the powerleads 8. The earth lead 7 and power leads 8 each includes at least one connecting lead extending outwardly from the semiconductor element 1 next to one of the outer signal leads 9. Preferably, each of the power leads 8 includes two such connecting leads widely spaced apart from each other and each trapezoidal portion of the earth lead 7 includes two such widely spaced apart connecting leads. The second layer of leads includes the inner leads 10 An insulating substrate 11 surrounding the semiconductor element 1 separates the two layers of leads and supports the inner leads 10. The relatively wide, large area, trapezoidal portions of the earth lead 7 and of the trapezoidal power leads 8 in the package body 6 serve as a heat radiator. A large number of outer signal leads 9 are formed outside the outer periphery of the earth lead 7 and the power leads 8 and are connected to respective electrodes 2 of the semiconductor element 1 by respective inner leads 10 and the Au wires 5. In FIG. 1, a sealing resin 6a is not shown.

Figure 3:
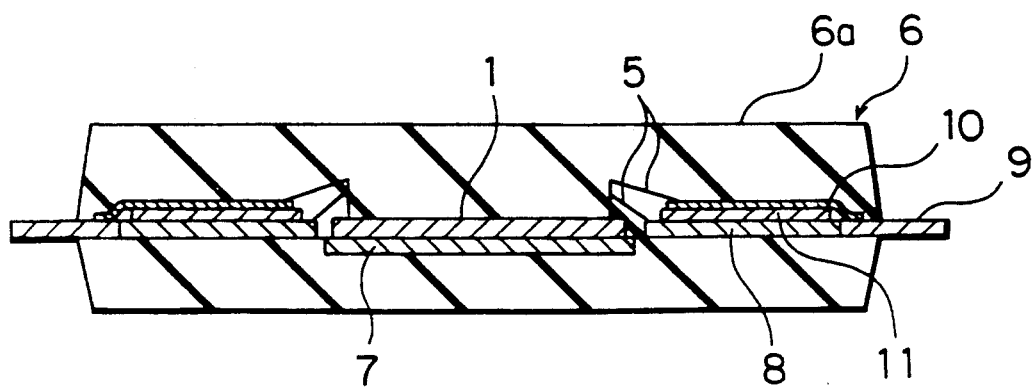
FIG. 3 is a sectional side view of the semiconductor device shown in FIG. 2.

FIG. 3 is a sectional side view of the semiconductor device shown in FIG. 2. The drawing shows a plurality of inner leads 10 formed on the insulating substrate 11, for example, a polyimide tape.

Figure 4:
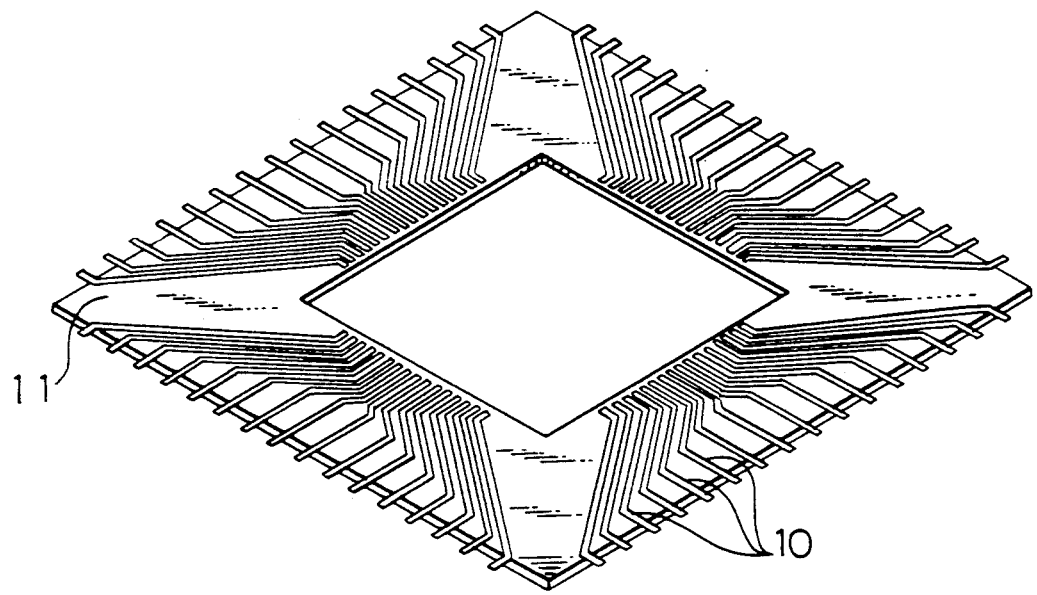
FIG. 4 is a schematic perspective view showing the leads and the insulating substrate of the semiconductor packaging device shown in FIGS. 2 and 3.
Figure 5:
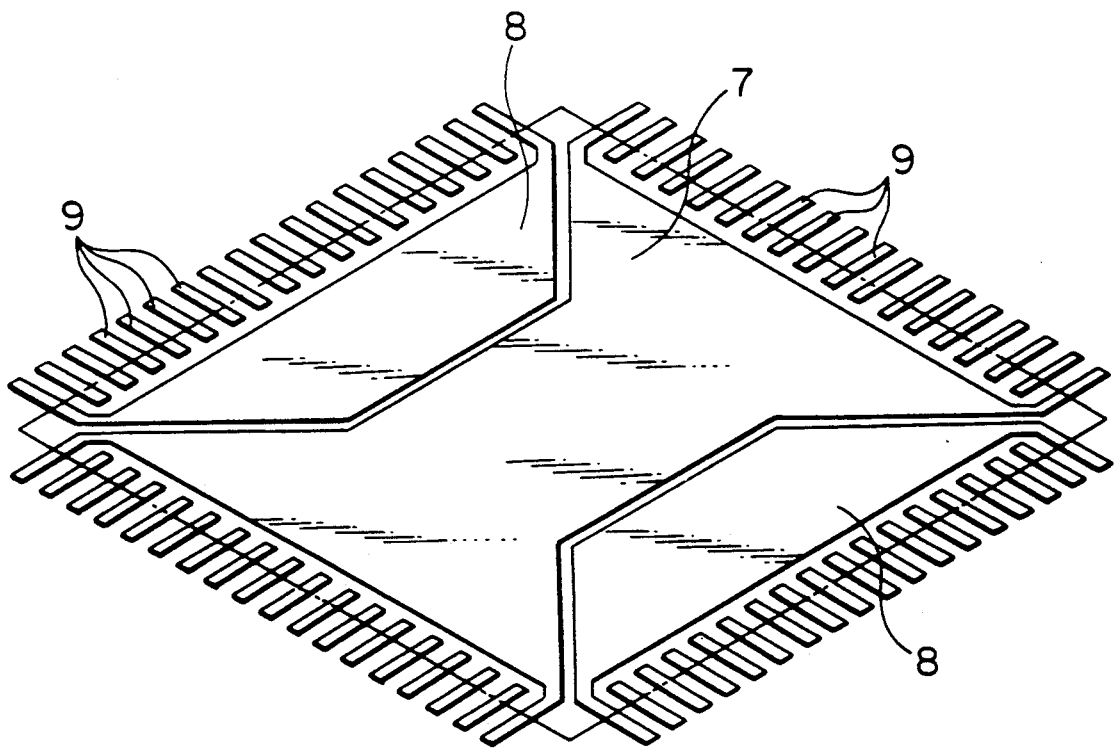
FIG. 5 is a schematic perspective view showing the earth lead, the power leads and the signal leads of the semiconductor packaging device shown in FIGS. 2 and 3.

FIG. 4 is a schematic perspective view which shows the inner leads 10 and the insulating substrate 11 of the semiconductor device packaging element shown in FIGS. 2 and 3. FIG. 5 is a schematic perspective view which shows the earth lead 7, the power leads 8 and the outer signal leads 9 of the packaging element. In the drawings, the external ends of the inner leads 10 formed on the insulating substrate 11 are respectively connected to the outer signal leads 9. The semiconductor element 1 is placed on the central, generally rectangular portion of the earth lead 7, and the electrodes 2 of the semiconductor element 1 are connected to inner ends of the inner leads 10 through the Au wires 5. As shown in FIG. 3, the above members are sealed with the sealing resin 6a, for example, an epoxy resin, to form the package body 6 from which the outer signal leads 9 are partially exposed.

In the packaged semiconductor device configured as described above, the heat generated from the semiconductor element 1 during the operation of the semiconductor device is mainly transmitted to the earth lead 7 and the power leads 8, which have excellent thermal conductivity, and then effectively to the outside of the packaged semiconductor device. It is therefore possible to use a semiconductor element 1 which consumes much electricity, i.e., has a high heating value. In addition, since the earth lead 7 and the power leads 8 occupy a large area, the inductance of the power system which extends from the power source to the earth is reduced.

As described above, the present invention has trapezoidal power leads and earth leads, which serve as heat radiators and which are provided in the package body. The present invention provides an inexpensive packaged semiconductor device which exhibits excellent heat release properties and electrical characteristics.

What is claimed is:

1. A packaged semiconductor device comprising:
   a first layer of electrical leads including generally trapezoidal power leads and an earth lead including generally trapezoidal portions joined by a generally rectangular bridging portion disposed adjacent to said power leads;
   a semiconductor element disposed on said bridging portion of said earth lead and having a plurality of electrodes;
   an insulating substrate having opposed first and second sides, said power leads and earth lead being disposed on the first side of said insulating substrate, said insulating substrate including a central opening in which said semiconductor element is disposed;
   a second layer of electrical conductors disposed on the second side of said insulating substrate including a plurality of inner leads, each inner lead having an inner end disposed proximate the semiconductor element and an opposed outer end;
   metal wires electrically connecting respective inner ends of said inner leads to respective electrodes;
   a plurality of signal leads disposed in substantially the same plane as the first layer of electrical conductors, each signal lead being electrically connected to the outer end of a respective inner lead; and
   a sealing resin encapsulating part of said signal leads, part of said power leads, part of said earth lead, said inner leads, said semiconductor element, and said wires and forming a package body.

2. The packaged semiconductor device of claim 1 wherein each of said power leads and said earth lead includes a connecting lead extending adjacent one of said outer signal leads from said package body.

3. A semiconductor device package element comprising:
   a first layer of electrical leads including generally trapezoidal power leads and an earth lead including generally trapezoidal portions joined by a generally rectangular bridging portion disposed adjacent to said power leads;
   an insulating substrate having opposed first and second sides, said power leads and earth lead being disposed on the first side of said insulating substrate, said insulating substrate including a central opening for receiving a semiconductor element;
   a second layer of electrical conductors disposed on the second side of said insulating substrate including a plurality of inner leads, each lead having an inner end disposed proximate the central opening and an opposed outer end; and
   a plurality of signal leads disposed in substantially the same plane as the first layer of electrical conductors, each signal lead being electrically connected to the outer end of a respective inner lead.

4. The packaged semiconductor device of claim 3 wherein each of said power leads and said earth lead each includes a connecting lead extending adjacent one of said outer signal leads from said package body.

5. A semiconductor device package element comprising:
   a first layer of electrical leads including generally trapezoidal power leads and an earth lead including generally trapezoidal portions disposed adjacent to said power leads;
   an insulating substrate having opposed first and second sides, said power leads and earth lead being disposed on the first side of said insulating substrate, said insulating substrate including central opening for receiving a semiconductor element;
   a second layer of electrical conductors disposed on the second side of said insulating substrate including a plurality of inner leads, each lead having an inner end disposed proximate the central opening and an opposed outer end; and
   a plurality of signal leads disposed in substantially the same plane as the first layer of electrical conductors, each signal lead being electrically connected to the outer end of a respective inner lead.

6. The packaged semiconductor device of claim 5 wherein each of said power leads and said earth lead each includes a connecting lead extending adjacent one of said outer signal leads.

* * * * *